(12) United States Patent
Jeon (10) Patent No.: US 11,769,807 B2
(45) Date of Patent: Sep. 26, 2023

(54) LATERAL TRANSISTOR WITH EXTENDED SOURCE FINGER CONTACT

(71) Applicant: SEMICONDUCTOR COMPONENTS INDUSTRIES, LLC, Phoenix, AZ (US)

(72) Inventor: Woochul Jeon, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 249 days.

(21) Appl. No.: 16/948,788

(22) Filed: Oct. 1, 2020

(65) Prior Publication Data
US 2022/0037485 A1    Feb. 3, 2022

Related U.S. Application Data (60) Provisional application No. 62/706,134, filed on Aug. 3, 2020.

(51) Int. Cl.
| | |
|---|---|
| *H01L 29/66* | (2006.01) |
| *H01L 29/417* | (2006.01) |
| *H01L 29/778* | (2006.01) |
| *H01L 29/20* | (2006.01) |

(52) U.S. Cl.
CPC .. *H01L 29/41758* (2013.01); *H01L 29/66462* (2013.01); *H01L 29/778* (2013.01); *H01L 29/2003* (2013.01)

(58) Field of Classification Search
CPC ........... H01L 29/41758; H01L 23/4824; H01L 29/2003; H01L 29/205; H01L 29/778–7789; H01L 27/0605
See application file for complete search history.

(56) References Cited

U.S. PATENT DOCUMENTS

| | | | |
|---|---|---|---|
| 7,250,641 B2* | 7/2007 | Saito | H01L 29/404 |
| | | | 257/E27.012 |
| 9,691,757 B2* | 6/2017 | Miura | H01L 27/0629 |
| 9,842,920 B1 | 12/2017 | Jeon et al. | |
| 2007/0090373 A1 | 4/2007 | Beach et al. | |
| 2010/0117162 A1* | 5/2010 | Rohrer | H01L 29/41758 |
| | | | 716/136 |
| 2011/0198669 A1* | 8/2011 | Kaya | H01L 29/7787 |
| | | | 257/E21.446 |
| 2012/0025188 A1* | 2/2012 | Yamaki | H01L 23/4824 |
| | | | 257/E23.01 |
| 2019/0081141 A1* | 3/2019 | Mizan | H01L 23/5226 |
| 2020/0312968 A1* | 10/2020 | Kasahara | H01L 29/1608 |
| 2021/0280508 A1* | 9/2021 | Sueyama | H01L 23/4824 |

* cited by examiner

*Primary Examiner* — Eric A. Ward
(74) *Attorney, Agent, or Firm* — Brake Hughes Bellermann LLP (57) ABSTRACT

Semiconductor devices, such as a lateral HEMT, may display current flow between a plurality of interdigitated source fingers and drain fingers, and controlled by a common gate connection. An extended source finger contact may enable improved voltage control across the source fingers, even for large devices with many and/or lengthy source fingers. In this way, unwanted subthreshold operations and switching oscillations may be avoided by reliably maintaining a source voltage at a desired level, to thereby provide fast and reliable switching.

20 Claims, 11 Drawing Sheets

LATERAL TRANSISTOR WITH EXTENDED SOURCE FINGER CONTACT

CROSS-REFERENCE TO RELATED APPLICATIONS

This application claims the benefit of U.S. Provisional Patent Application No. 62/706,134, filed on Aug. 3, 2020, the entire contents of which is incorporated herein by reference.

TECHNICAL FIELD

This description relates to power transistors.

BACKGROUND

A High Electron Mobility Transistor (HEMT) is a type of transistor that utilizes a current channel formed using a heterojunction at a boundary between two materials having different band gaps. For example, a relatively wide band gap material such as AlGaN (Aluminum Gallium Nitride) may be doped with n-type impurities and used to form a junction with an undoped, relatively narrow band gap material, such as GaN (Gallium Nitride). Then, an equilibrium is reached in which the narrow band gap material has excess majority carriers that form a 2-dimensional electron gas (2DEG). Consequently, and because the narrow band gap material has no doping impurities to disrupt current flow through scattering, HEMT devices provide, among other advantages, very high switching speeds, high gains, and high power applications.

SUMMARY

According to one general aspect, a semiconductor device includes a source pad connected to a plurality of source fingers, and a drain pad connected to a plurality of drain fingers that are interdigitated with the plurality of source fingers. The semiconductor device may include a gate pad connected to a gate and to a gate feed that extends at least partially around the source pad and the drain pad, and an extended source finger contact connected to the source pad and to a source finger of the plurality of source fingers, and extending in parallel with the source finger.

According to another general aspect, a semiconductor device may include a plurality of drain fingers, a drain pad connected to the plurality of drain fingers, a plurality of source fingers that are parallel to, and interdigitated with, the plurality of drain fingers, and a source pad connected to the plurality of source fingers. The semiconductor device may include a gate pad connected to a gate feed that extends around at least a portion of the source pad or the drain pad, and an extended source finger contact connected to the source pad and extending in a direction of the drain pad, and at least partially within the gate feed.

According to another general aspect, a method of making a semiconductor device may include connecting a source pad to a plurality of source fingers, and connecting a drain pad connected a plurality of drain fingers that are interdigitated with the plurality of source fingers. The method may include connecting a gate pad to a gate and to a gate feed that extends at least partially around the source pad and the drain pad, and connecting an extended source finger contact to the source pad and to a source finger of the plurality of source fingers, and extending in parallel with the source finger in a direction of the drain pad.

The details of one or more implementations are set forth in the accompanying drawings and the description below. Other features will be apparent from the description and drawings, and from the claims.

DETAILED DESCRIPTION

As described in detail below, embodiments include a semiconductor device that includes a lateral HEMT, such as a lateral GAN HEMT, in which current flow between a plurality of interdigitated source fingers and drain fingers is controlled by a common gate connection. Embodiments may be scaled up to relatively large sizes, e.g., by increasing a number and/or length of the source fingers and drain fingers. As a result, such devices are suitable for high voltages, high currents, and fast switching speeds.

Moreover, an extended source finger contact may be provided that enables improved voltage control (e.g., more consistent voltage distribution) across the source fingers, even for large devices with many and/or lengthy source fingers. In this way, unwanted subthreshold operations and switching oscillations may be avoided by reliably maintaining a source voltage at a desired level, to thereby provide fast and reliable switching.

Figure 1:
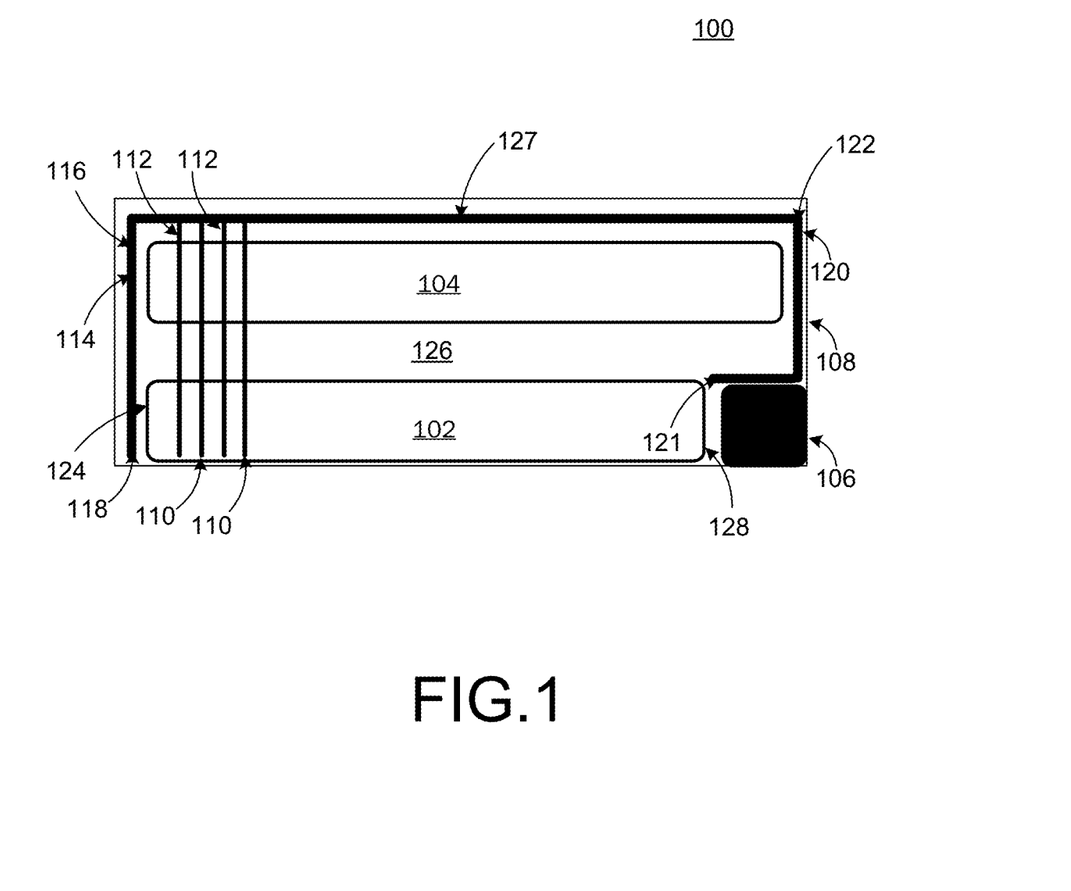
FIG. 1 illustrates a simplified diagram of a lateral transistor structure with an extended source finger contact.

FIG. 1 illustrates a simplified top view (e.g., plan view) diagram of a lateral GaN power device 100 with an extended source finger contact 114. In the simplified example of FIG. 1, the lateral GaN power device 100 includes a source pad 102, a drain pad 104, and a gate pad 106 that is connected to a gate feed 108. The gate feed 108 extends around the source pad 102 and the drain pad 104, to and provides a common gate connection and gate voltage for the lateral GaN power device 100.

Figure 5:
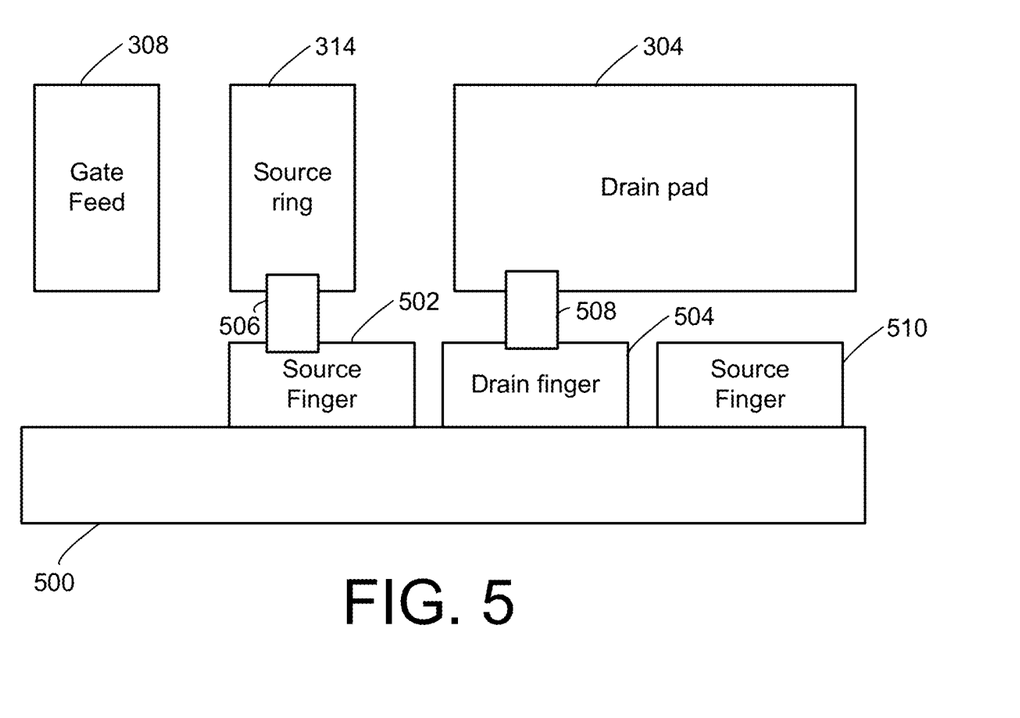
FIG. 5 is a cross-section of the more detailed view of FIG. 4.

The lateral GaN power device 100 of FIG. 1 further includes a plurality of interdigitated source fingers 110 and drain fingers 112. As described below, the source fingers 110 may be electrically connected to the source pad 102, while the drain fingers 112 may be electrically connected to the drain pad 104. That is, as shown in the example of FIG. 5, a connection may be established in a direction into the page from the drain pad 104 to the drain fingers 112, and from the source pad 102 to the source fingers 110. Accordingly, a common source voltage may be applied to the source fingers 110, and a common drain voltage may be applied to the drain fingers 112.

In the present description, interdigitating refers to alternating source fingers 110 and drain fingers 112. However, it is not required that all such fingers be of the same size (e.g., width, thickness, or length). There need not be the same number of source fingers 110 and drain fingers 112, and the fingers need not interdigitate on a one-for-one basis. Further, individual fingers need not be of constant dimension (e.g., may be thicker at one end than the other).

The simplified example of FIG. 1 illustrates a small number of source fingers 110 and drain fingers 112. The following examples illustrate that the source fingers 110 and the drain fingers 112 may be present across the length(s) of the source pad 102 and the drain pad 104.

Further in FIG. 1, the source pad 102 and the drain pad 104 are illustrated transparently, so that entire lengths of the source fingers 110 and the drain fingers 112 are visible. In the following examples, inasmuch as the source pad 102 and the drain pad 104 overlay the source fingers 110 and the drain fingers 112, only portions of the source fingers 110 and the drain fingers 112 within an inter-pad space 126 may be visible from a top view perspective.

In FIG. 1, an extended source finger contact portion 116 of the extended source finger contact 114 is connected to, overlays, and is parallel to, an underlying source finger 118 (not separately visible in FIG. 1) of the source fingers 110. For example, the underlying source finger 118 may be a final or outermost source finger of the source fingers 110 in a direction perpendicular to the interdigitated source/drain fingers. For example, the underlying source finger 118 may be a source finger located closest to the gate feed 108.

Similarly, in some embodiments, an extended source finger contact portion 120 may be connected to, overlay, and be parallel to an underlying source finger 122 (not shown in FIG. 1). In other embodiments, the extended source finger contact portion 120 may extend through extended source finger contact portion 121 to contact the source pad 102. Thus, the extended source finger contact 114 contact may extend around and enclose the drain pad 104 within a plane, and connect with the source pad 102 at a first edge 124 of the source pad 102 and a second edge 128 of the source pad 102, as shown.

Further in FIG. 1, an extended source finger contact portion 127 may extend in a direction perpendicular to the interdigitated source/drain fingers, and perpendicular to the extended source finger contact portions 116, 120. Therefore, in FIG. 1, the extended source finger contact 114 may provide at least a partial loop or ring around the source pad 102 and the drain pad 104, so that such embodiments with this and similar implementations of the extended source finger contact 114 may be referred to as a source contact ring. As illustrated in FIG. 1, the extended source finger contact portion 127 may connect to, or be in contact with, the source fingers 110. For example, the extended source finger contact portion 127 may be in contact with end portions of the source fingers 110.

In other implementations, the extended source finger contact 114 may include more or fewer portions than the extended source finger contact portions 116, 120, 127 of the source contact ring of FIG. 1. For example, the extended source finger contact 114 may include only the extended source finger contact portion 116 (or portions thereof), or the extended source finger contact portion 120 (or portions thereof).

Figure 2:
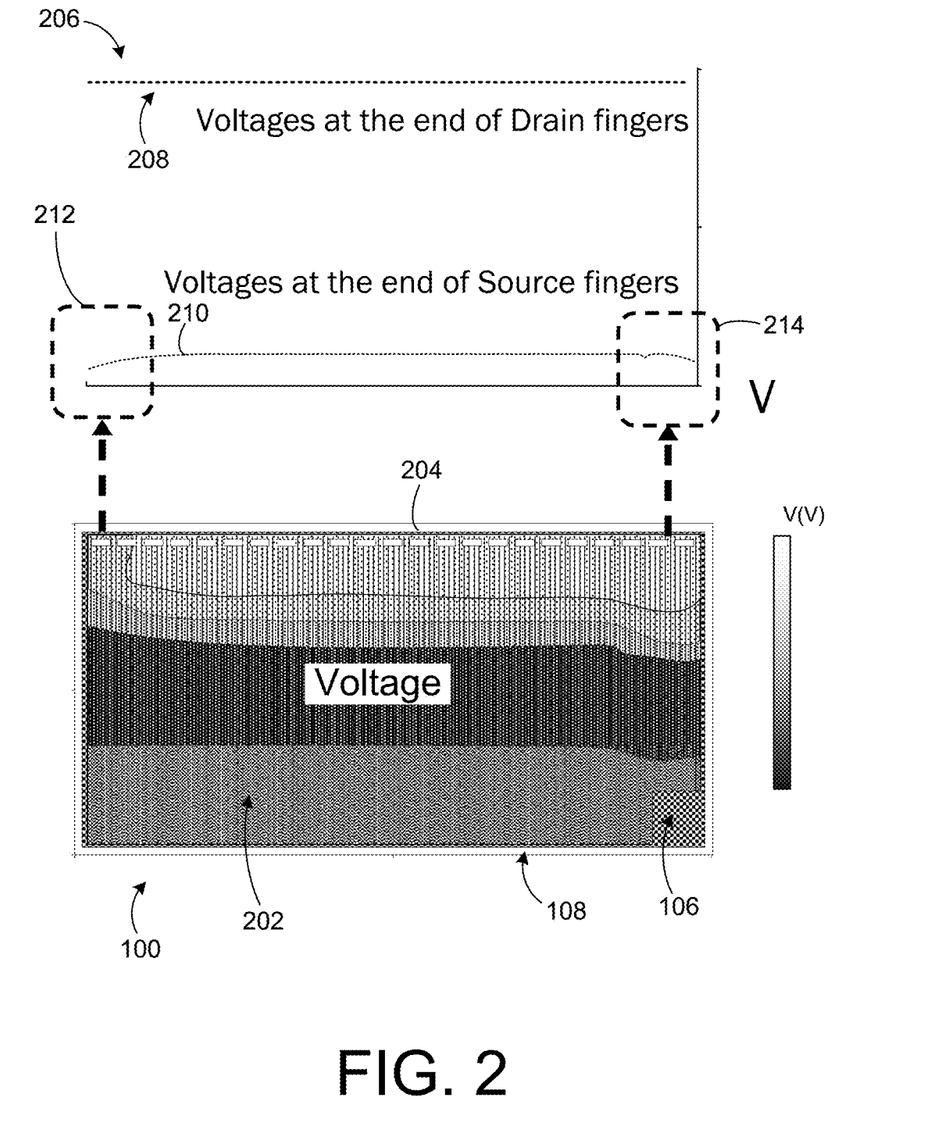
FIG. 2 illustrates a voltage distribution of the embodiment of FIG. 1.

In such implementations, and others, the extended source finger contact 114 provides improved source voltage control for the source fingers 110 as a whole. For example, FIG. 2 illustrates a top view of an implementation of the lateral GaN power device 100 of FIG. 1, with an overlaid voltage distribution 202.

Dashed line 204 corresponds to locations of the lateral GaN power device 100 and a corresponding portion of the overlaid voltage distribution 202, represented in graph 206. In other words, the dashed line 204 corresponds to portions of the voltage distribution 202 occurring across ends of the source fingers 110 and the drain fingers 112 of FIG. 1.

As shown in the graph 206, a drain voltage 208 occurring at the ends of the drain fingers 112 is maintained consistently, e.g., at 1V. A source voltage 210 occurring at the ends of the source fingers 110, including the underlying source fingers 118, 122 contacted by the extended source finger contact portions 116, 120 of the extended source finger contact 114, is consistently maintained at a low level, e.g., close to 0V. In particular, as illustrated in graph portions 212, 214 of the source voltage 210, source voltages are maintained at low levels even at the ends of the source fingers 110 that are at corners of the lateral GaN power device 100.

Conversely, without the extended source finger contact 114 of FIG. 1, the lateral GaN power device 100 may be prone to exhibiting unwanted high source voltages, particularly at corner portions corresponding to the graph portions 212, 214. Such undesired source voltages, as referenced above, may lead to a number of undesired results in operating the lateral GaN power device 100, which are mitigated or eliminated through the use of the extended source finger contact 114.

For example, such undesired results may include undesired switching behavior, such as oscillations. The lateral GaN power device 100 may be difficult to turn on within operational voltage ranges, may exhibit sub-threshold operation, and may experience device failure, particularly at the corners corresponding to the graph portions 212, 214. Conversely, the extended source finger contact 114 provides improved voltage control, including corresponding reductions in finger resistance and improvements in inductance control, while providing fast and reliable switching characteristics.

Figure 3:
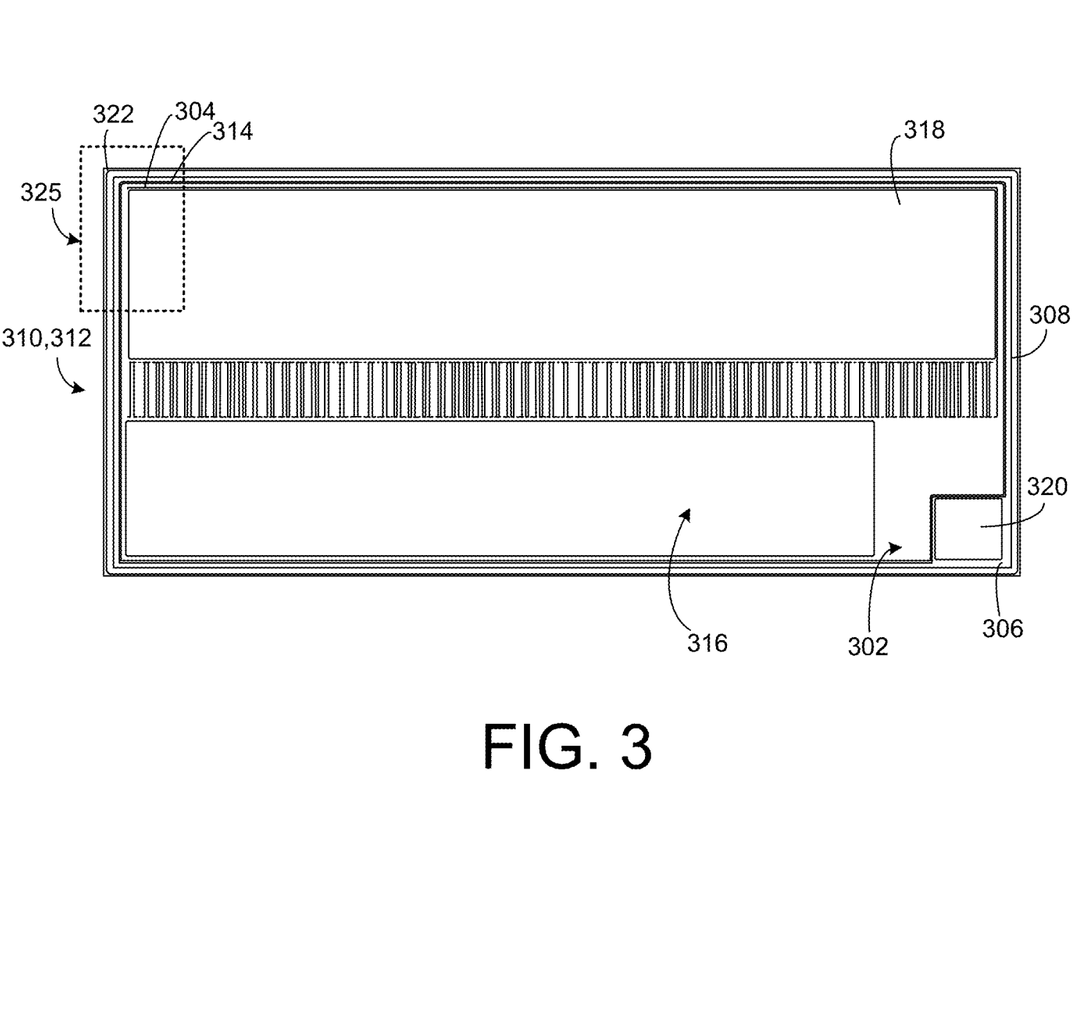
FIG. 3 illustrates an alternate embodiment of the embodiment of FIG. 1.

FIG. 3 illustrates a top view of an alternate embodiment of the embodiment of FIG. 1. In FIG. 3, a source pad 302, a drain pad 304, and a gate pad 306 are illustrated as instances of the source pad 102, drain pad 104, and gate pad 106 of FIG. 1, respectively. Also analogous to FIG. 1, a gate feed 308 extends around a plurality of interdigitated source and drain fingers 310, 312. An extended source finger contact 314 extends around the source pad 302 and the drain pad 304, to form a source contact ring.

In FIG. 3, source pad opening 316, drain pad opening 318, and gate pad opening 320 illustrate contact openings for the source pad 102, the drain pad 104, and the gate pad 106, respectively. Further, a guard ring structure 322 is illustrated around an entire perimeter of the device. Highlighted portion 325 is illustrated in more detail in FIGS. 4 and 5.

Figure 4:
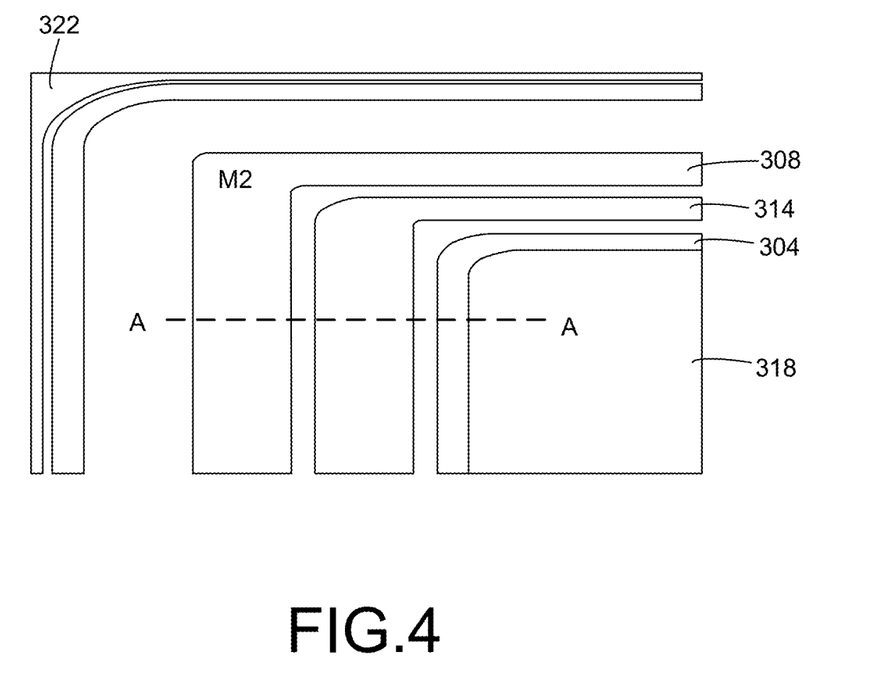
FIG. 4 illustrates a more detailed view of a portion of the embodiment of FIG. 3.

Specifically, FIG. 4 illustrates a top view of the drain pad 304, extended source finger contact 314, gate feed 308, and drain pad opening 318 in more detail, while FIG. 5 is a side cross-sectional view of the more detailed view of FIG. 4, taken at line A-A. As is visible in FIG. 5, individual source fingers 502 and 510 may be formed on a substrate 500, with a drain finger 504 in between. As also shown, the source finger 502 is connected to the extended source finger contact 314 by a metal connection 506, while the drain finger 504 is connected to the drain pad 304 by metal connection 508.

In some example implementations, the source finger 502 and the source finger 510 may be made during a single metallization process, and may have the same dimensions of width, height, and/or length. In other implementations, examples of which are discussed below, the source finger 502 underlying the extended source finger contact 314, or other source fingers of the source fingers 310, may be formed with different dimensions than remaining source fingers of the source fingers 310. For example, as described with respect to FIG. 6 (top view), below, such source fingers may be thicker and/or wider than remaining source fingers of the source fingers 310, to facilitate improved voltage distribution control such as shown in FIGS. 2 and 7.

In these and other embodiments, different types of metal may be used to obtain desired effects. For example, in the following, a first type of metal referenced as M1 may refer to a relatively thinner metal typically used to form the source fingers 502, 510 and the drain finger 504. A second type of metal referenced as M2 may refer to a relatively thicker metal that may be used to form the extended source finger contact 314. The terms M1 and M2 may refer to any suitable type of metal, such as various Aluminum (Al)-based metals. In some implementations, M2 may be used to form the gate feed 308, so that the extended source finger contact 314 may be easily formed in conjunction with formation of the gate feed 308.

Then, in some embodiments, M2 may be at least twice as thick as M1. For example, if the source finger 502 is formed using M1 and is about 1 micron thick, the extended source finger contact 314 may be at least 2 microns thick, but may be as much as 4 microns thick, or more.

However, in various embodiments, absolute and relative thicknesses of M1 and M2 may be selected as design parameters that may be influenced by other related design parameters. For example, a total cross-sectional area of the source finger 502, the source finger 510, and the extended source finger contact 314 (e.g., the cross-sectional area(s) illustrated in FIG. 5) may be selected by selecting corresponding thicknesses and widths. In some such cases, a single type of metal may be used by adjusting relative sizes in the manner(s) just referenced. Thus, for example, one or more source fingers may have a relatively larger cross-sectional area than other source fingers.

Similarly, a length of the extended source finger contact 314 may be selected relative to such parameters, and relative to other factors, such as a length(s) of the source finger 502, the source finger 510, and the drain finger 504. For example, as referenced with respect to FIG. 1, the extended source finger contact 314 may extend partially to a desired length or distance along either or both side(s) of the lateral GaN power device of FIG. 3, or may extend around an entire perimeter thereof, as illustrated.

Figure 6:
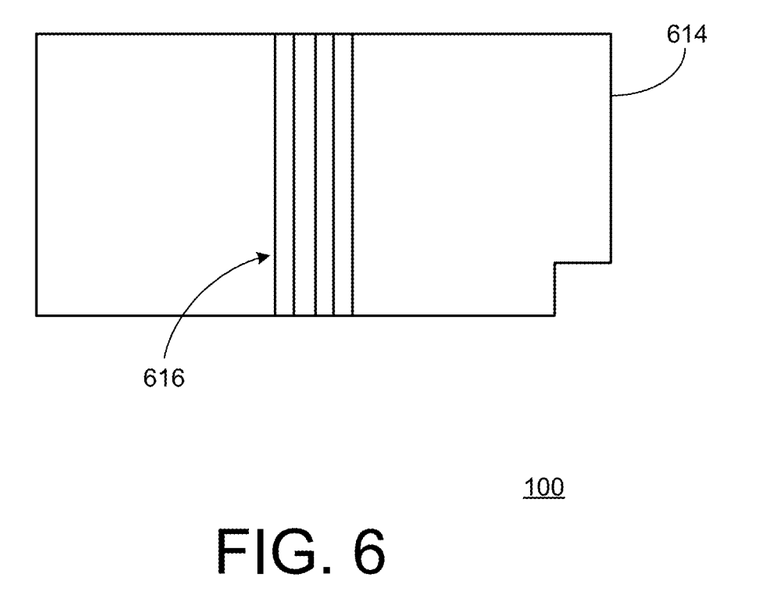
FIG. 6 illustrates additional examples of extended source contact fingers that may be used in described embodiments.
Figure 7:
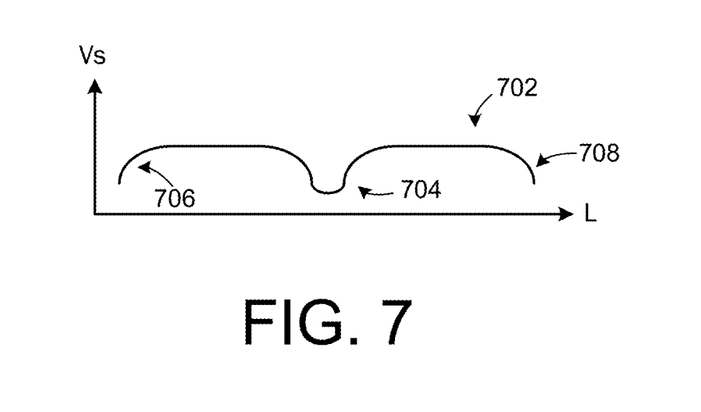
FIG. 7 is a graph illustrating an example voltage distribution corresponding to the example of FIG. 6.

FIG. 6 illustrates additional examples of extended source contact fingers that may be used in described embodiments. FIG. 7 is a graph illustrating an example voltage distribution corresponding to the example of FIG. 6.

FIG. 6 illustrates that a source ring 614 may be formed using the extended source finger contact as described herein. Additional source fingers 616 may be included at a middle or central portion of the plurality of source fingers that have increased cross-sectional area or dimensions (thickness and/or width) relative to remaining source fingers. That is, at least one source finger is included in the plurality of source fingers that has relatively a larger cross-sectional area than remaining source fingers of the plurality of source fingers. Additionally, or alternatively, additional source finger contacts may be included at the illustrated middle or interior positions of the source fingers 616.

Then, as shown in FIG. 7, the source fingers 616 may reduce a source voltage at corresponding portions of a resulting voltage distribution 702. Specifically, the voltage distribution 702 may be lower as a whole than a corresponding voltage distribution without the source ring 614 and the source fingers 616. Further, source voltages at edge portions 706, 708 are additionally reduced, as described with respect to FIG. 2, while additional source voltage reductions are obtained at a portion 704 due to the source fingers 616.

Figure 8:
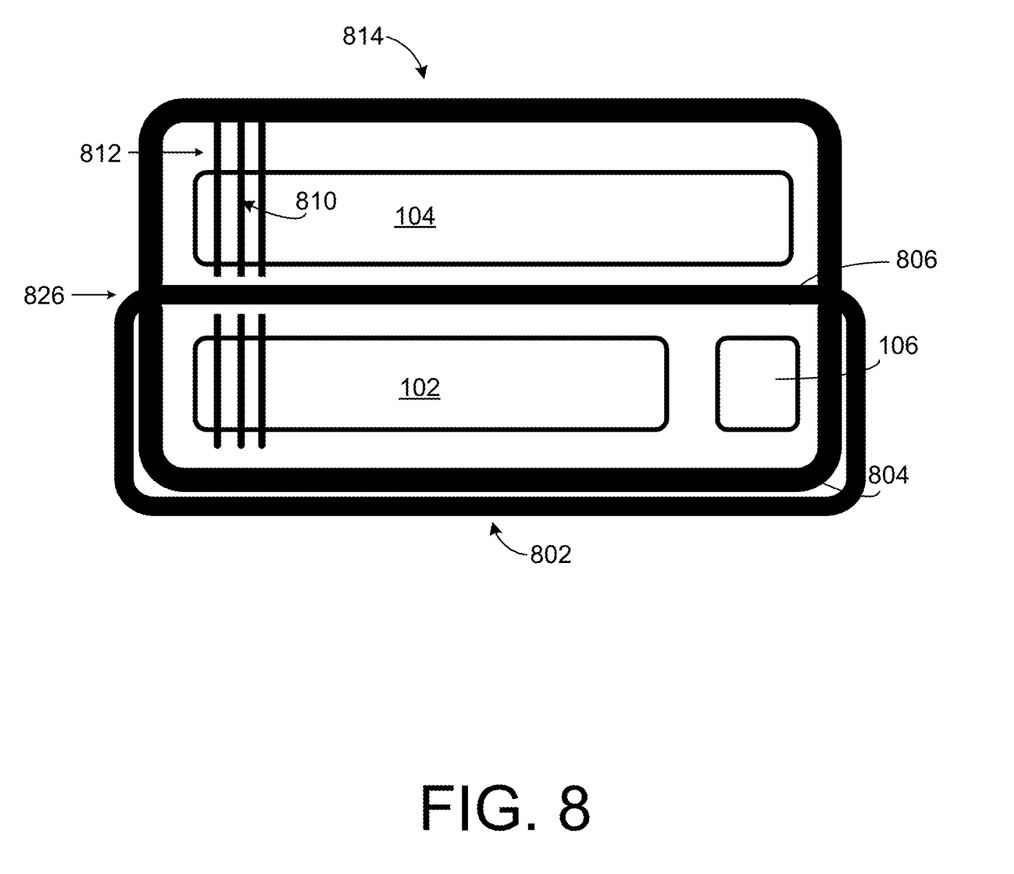
FIG. 8 illustrates an additional example embodiment of FIG. 1, with a middle gate feed.

FIG. 8 illustrates a top view of an additional example embodiment of FIG. 1, with a middle gate feed 806. The simplified example of FIG. 8 is similar to that of FIG. 1, with interdigitated source fingers 810 and drain fingers 812, but a gate feed 802 includes a gate feed portion 804 corresponding to a lower portion of the gate feed 108 of FIG. 1, and a middle gate feed 806 that extends through an inter-pad space 826 corresponding to the inter-pad space 126 of FIG. 1. FIG. 8 also illustrates a source ring 814, corresponding to the illustrated extended source finger contact 114 of FIG. 1.

The middle gate feed 806 may provide additional switching stability and otherwise accentuate or supplement advantages described with respect to the source ring 814. The lower gate feed portion 804 may be made using either metal M1 or M2, or other suitable gate metal. The middle gate feed 806 may be formed using a metal sufficiently thin to be provided within the inter-pad space 826, such as M1. Thus, in some implementations, the middle gate feed 806 may be formed using a different metal than the lower gate feed portion 804.

Figure 9:
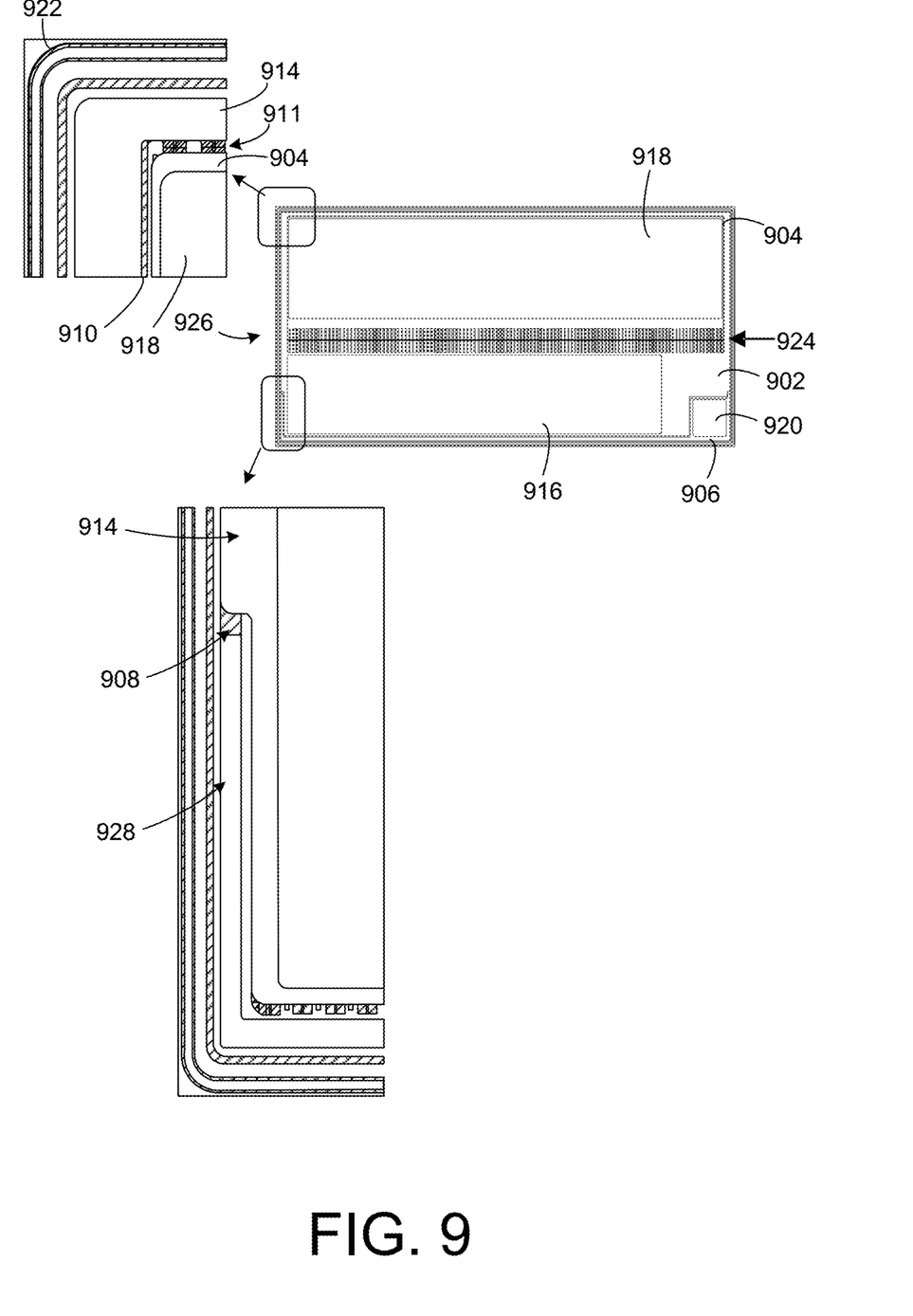
FIG. 9 is a more detailed example embodiment of FIG. 8.

In FIG. 9 (top view diagram), a source pad 902, a drain pad 904, and a gate pad 906 are illustrated. Source pad opening 916, drain pad opening 918, and gate pad opening 920 are also illustrated. The structure of FIG. 9 is enclosed within the plane of the device by a guard ring structure 922.

A gate feed 908 of a relatively thinner M1 metal may extend around at least the source pad 902, including a middle gate feed 924. The middle gate feed 924 may extend through inter-pad space 926 in the manner illustrated in FIG. 8. An additional gate feed 928 may overlay, and be connected to, the gate feed 908. The additional gate feed 928 may be formed relatively thicker and/or wider than the gate feed 908, e.g., using a thicker M2 metal.

In FIG. 9, a source finger 910 of a plurality of source fingers extends under a source ring 914. As shown, the source ring 914 may be made of a relatively thicker and/or wider M2 metal. The source ring 914 may extend laterally over at least a portion of the gate feed 908, in addition to overlaying an underlying source finger 911.

Figure 10:
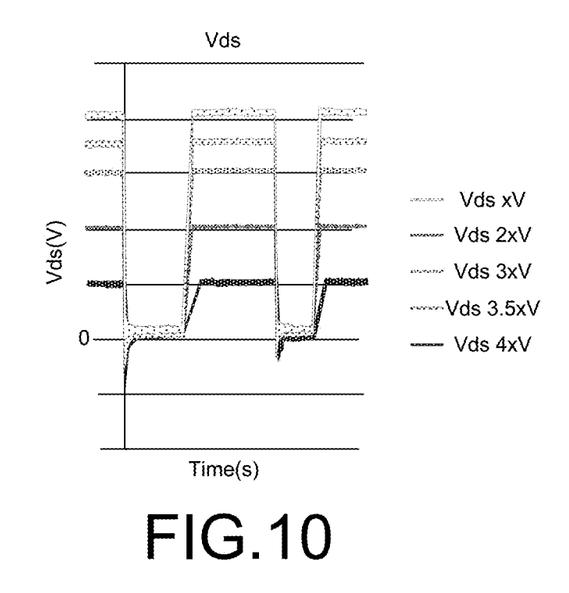
FIG. 10 is a graph illustrating drain-source voltage characteristics of the embodiment of FIG. 9.
Figure 11:
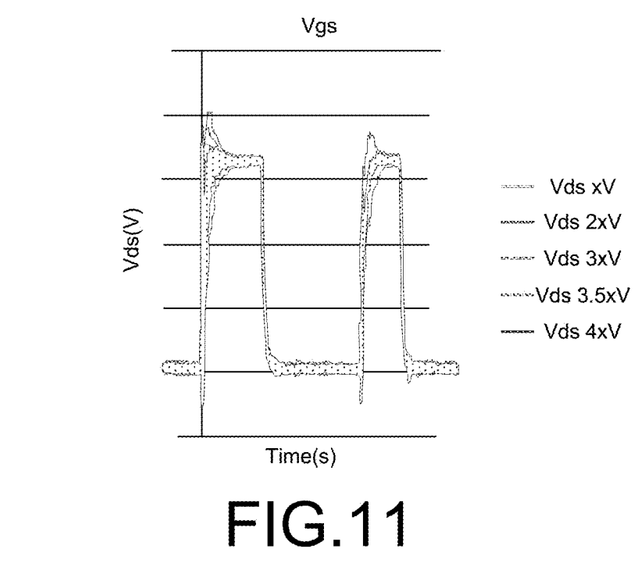
FIG. 11 is a graph illustrating gate-source voltage characteristics of the embodiment of FIG. 9.

FIG. 10 is a graph illustrating drain-source voltage characteristics of the embodiment of FIG. 9. FIG. 11 is a graph illustrating gate-source voltage characteristics of the embodiment of FIG. 9. FIGS. 10-11 illustrate stable and responsive switching behaviors across a range of voltages, with stable gate voltage.

Figure 12:
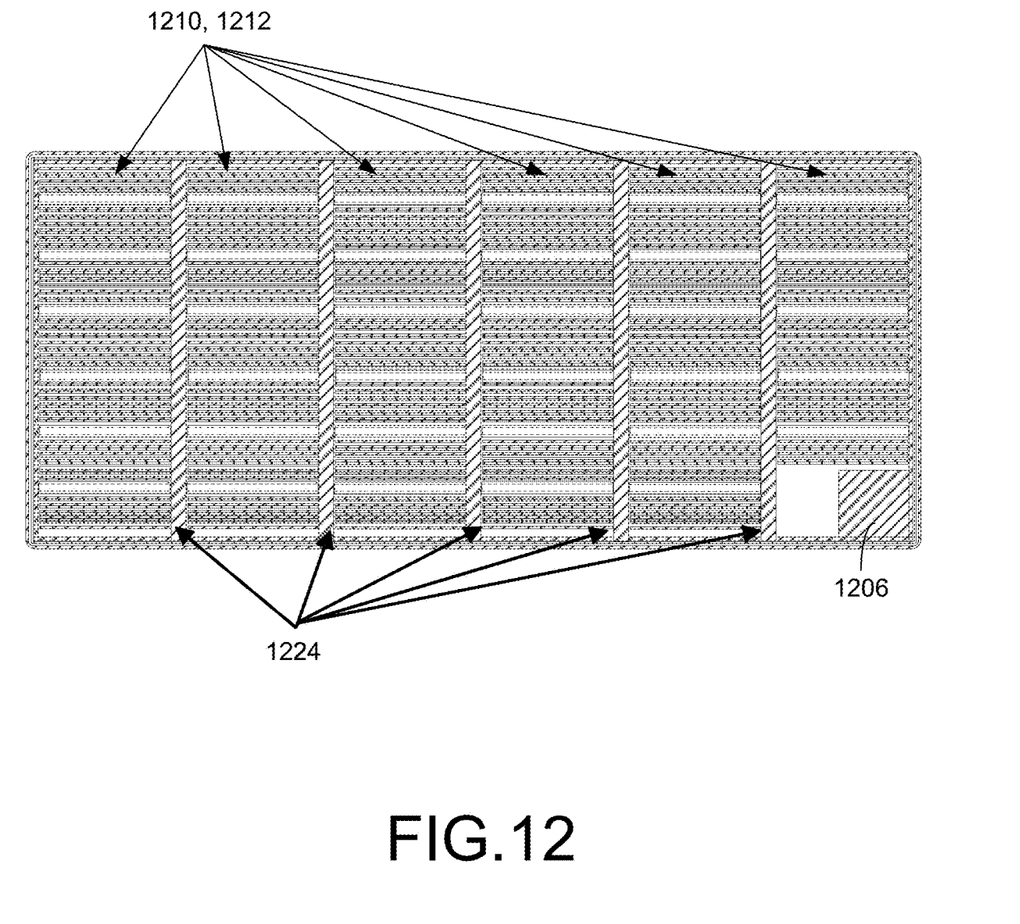
FIG. 12 illustrates an alternate embodiment of the embodiments of FIGS. 1 and 9.
Figure 13:
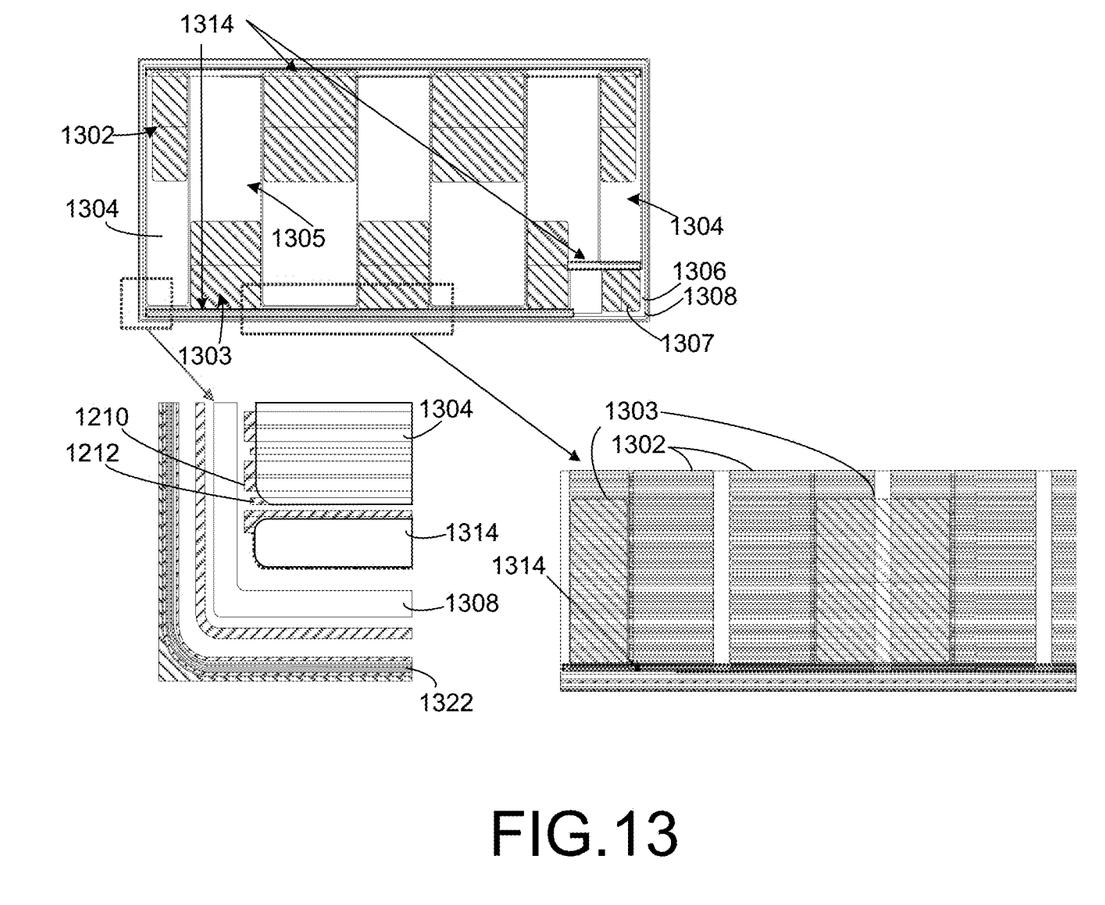
FIG. 13 is a more detailed view of the example embodiment of FIG. 12.

FIGS. 12 and 13 (both top views) illustrate an alternate embodiment of the embodiments of FIGS. 1 and 9. In FIG. 12, no source/drain/gate pads are included, in order to illustrate interdigitated source fingers 1210 and drain fingers 1212, which are rotated ninety degrees from the examples of FIGS. 1 and 9, and relative to a gate contact 1206. Also visible in FIG. 12 is a gate feed 1224, which extends between pairs of interdigitated source fingers 1210 and drain fingers 1212.

As may be seen in FIG. 13, drain pad openings 1302 and drain pads 1304, and source pad open 1303 and source pads 1305, are illustrated. Thus, multiple drain pads 1304 (with corresponding drain pad openings 1302), and source pads 1305 (with corresponding source pad openings 1303) are illustrated in an alternating pattern, with a final drain pad 1304 positioned over the gate of the device. Thus, each pair of drain pad 1304 and source pad 1305 may be connected to provide a same or similar structure as the pair of source pad 902 and drain pad 904 of FIG. 9, but with shorter, rotated source/drain finger lengths that provide correspondingly smaller devices within a similar space, defined by guard ring 1322.

In FIG. 13, an extended source finger contact 1314 extends along a top and bottom of the structure, as well as above a gate pad 1306 having a gate pad opening 1307, and within a gate feed 1308. Thus, the extended source finger contact 1314 may provide the various features and advantages described herein, but for the design of FIGS. 12 and 13.

Figure 14:
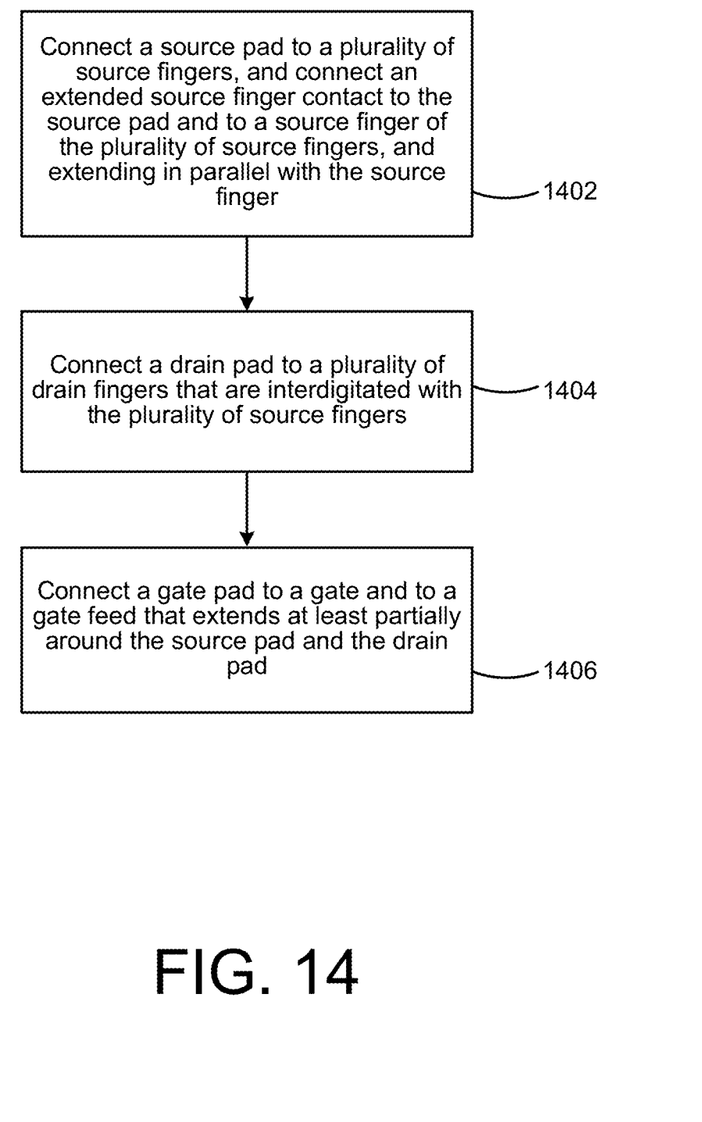
FIG. 14 is a flowchart illustrating example operations for making embodiments described herein.

FIG. 14 is a flowchart illustrating example operations for making embodiments described herein. For example, a lateral GaN HEMT may be formed.

In the example of FIG. 14, a source pad may be connected to a plurality of source fingers, and an extended source finger contact may be connected to the source pad and to a source finger of the plurality of source fingers, and extending in parallel with the source finger (1402).

A drain pad may be connected to a plurality of drain fingers that are interdigitated with the plurality of source fingers (1404). A gate pad may be connected to a gate and to a gate feed that extends at least partially around the source pad and the drain pad (1406). The gate feed may extend through an inter-pad space between the source pad and the drain pad.

As described herein, the extended source finger contact may be formed with a thickness at least twice that of the source finger. The extended source finger contact and the source finger may be positioned at an outermost or perimeter position of the interdigitated source and drain fingers.

In some implementations, a second extended source finger contact in parallel with a second source finger of the plurality of source fingers may be provided. The extended source finger contact may extend around the source pad and the drain pad, including a portion of the extended source finger contact that is perpendicular to a direction of the interdigitated source and drain fingers, to form a source ring.

At least one of the plurality of source fingers may have an increased area (e.g., thickness and/or width) relative to a remainder of the plurality of source fingers. For example, the source finger connected to the extended source finger contact may have an increased area, or a source finger at a central portion of the interdigitated source fingers and drain fingers may have an increased area.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device, comprising:
a plurality of source fingers in a first plane;
a source pad in a second plane and connected to the plurality of source fingers;
a plurality of drain fingers in the first plane and interdigitated with the plurality of source fingers;
a drain pad in the second plane and connected to the plurality of drain fingers;
a gate pad connected to a gate and to a gate feed that extends at least partially around the source pad and the drain pad; and
an extended source finger contact in the second plane and connected to the source pad and to a source finger of the plurality of source fingers, and extending in parallel with the source finger and at least partially around the drain pad.

2. The semiconductor device of claim 1, wherein the source finger is an outermost source finger at an edge of the plurality of source fingers.

3. The semiconductor device of claim 1, further comprising a second extended source finger contact connected to the source pad and to a second source finger of the plurality of source fingers, and extending in parallel with the second source finger in a direction of the drain pad.

4. The semiconductor device of claim 1, wherein the extended source finger contact encloses the drain pad within the second plane, and connects with the source pad at a first edge of the source pad and a second edge of the source pad, and connects with end portions of the plurality of source fingers.

5. The semiconductor device of claim 1, wherein the extended source finger contact has a thickness at least twice that of the source finger.

6. The semiconductor device of claim 1, wherein at least one source finger is included in the plurality of source fingers that has a relatively larger cross-sectional area than remaining source fingers of the plurality of source fingers.

7. The semiconductor device of claim 6, wherein the at least one source finger having the relatively larger cross-sectional area is the source finger.

8. The semiconductor device of claim 6, wherein the at least one source finger having the relatively larger cross-sectional area is a central source finger within a central portion of the plurality of source fingers.

9. The semiconductor device of claim 1, wherein the gate feed includes a gate feed portion that extends between an inter-pad space between the source pad and the drain pad.

10. The semiconductor device of claim 1, wherein the extended source finger contact is at least partially within the gate feed.

11. The semiconductor device of claim 1, wherein the semiconductor device includes at least one lateral GAN HEMT transistor.

12. A semiconductor device, comprising:
    a plurality of drain fingers in a first plane;
    a drain pad in a second plane and connected to the plurality of drain fingers;
    a plurality of source fingers in the first plane that are parallel to, and interdigitated with, the plurality of drain fingers;
    a source pad in the second plane and connected to the plurality of source fingers;
    a gate pad connected to a gate feed that extends around at least a portion of the source pad or the drain pad; and
    an extended source finger contact in the second plane and connected to the source pad and extending in a direction of the drain pad, at least partially around the drain pad, and at least partially within the gate feed.

13. The semiconductor device of claim 12, wherein the extended source finger contact is connected to a source finger of the plurality of source fingers, and extends in parallel with the source finger in the direction of the drain pad.

14. The semiconductor device of claim 12, wherein the gate feed includes a gate feed portion that extends between an inter-pad space between the source pad and the drain pad.

15. A method of making a semiconductor device, comprising:
    connecting a plurality of source fingers in a first plane to a source pad in a second plane;
    connecting a drain pad in the second plane to a plurality of drain fingers that are interdigitated with the plurality of source fingers within the first plane;
    connecting a gate pad to a gate and to a gate feed that extends at least partially around the source pad and the drain pad; and
    connecting an extended source finger contact in the second plane to the source pad and to a source finger of the plurality of source fingers, wherein the extended source finger contact extends in parallel with the source finger and at least partially around the drain pad.

16. The method of claim 15, wherein connecting the extended source finger contact comprises:
    connecting the extended source finger contact to the source finger with the source finger being an outermost source finger at an edge of the plurality of source fingers.

17. The method of claim 15, wherein connecting the extended source finger contact comprises:
    connecting a second extended source finger contact to the source pad and to a second source finger of the plurality of source fingers, and extending in parallel with the second source finger in a direction of the drain pad.

18. The method of claim 15, wherein the extended source finger contact has a thickness at least twice that of the source finger.

19. The method of claim 15, wherein at least one source finger is included in the plurality of source fingers that has a relatively larger cross-sectional area than remaining source fingers of the plurality of source fingers.

20. The method of claim 15, wherein the gate feed includes a gate feed portion that extends between an inter-pad space between the source pad and the drain pad.

* * * * *